US008852386B2

(12) United States Patent
Iizuka et al.

(10) Patent No.: US 8,852,386 B2
(45) Date of Patent: Oct. 7, 2014

(54) PLASMA PROCESSING APPARATUS

(75) Inventors: Hachishiro Iizuka, Yamanashi (JP); Yuki Mochizuki, Yamanashi (JP); Jun Abe, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 768 days.

(21) Appl. No.: 12/883,761

(22) Filed: Sep. 16, 2010

(65) Prior Publication Data

US 2011/0061813 A1 Mar. 17, 2011

Related U.S. Application Data

(60) Provisional application No. 61/252,184, filed on Oct. 16, 2009.

(30) Foreign Application Priority Data

Sep. 17, 2009 (JP) .................................. 2009-215586

(51) Int. Cl.
*H01L 21/3065* (2006.01)
*H01J 37/32* (2006.01)

(52) U.S. Cl.
CPC ..... *H01J 37/32834* (2013.01); *H01J 37/32091* (2013.01)
USPC ................................ 156/345.34; 156/345.33

(58) Field of Classification Search
CPC ..................... H01J 37/32091; H01J 37/32834; H01J 37/32513; H01J 37/32816
USPC ........................ 156/345.33, 345.34
See application file for complete search history.

(56) References Cited

U.S. PATENT DOCUMENTS

| 5,422,139 | A | * | 6/1995 | Fischer ...................... 427/248.1 |
| 5,614,026 | A | * | 3/1997 | Williams ............... 118/723 ME |
| 5,891,350 | A | * | 4/1999 | Shan et al. ...................... 216/71 |
| 6,579,373 | B2 | * | 6/2003 | Moriyama ..................... 118/724 |
| 6,620,520 | B2 | * | 9/2003 | O'Donnell et al. ........... 428/469 |
| 6,709,523 | B1 | * | 3/2004 | Toshima et al. ............... 118/725 |
| 6,828,254 | B2 | * | 12/2004 | Han et al. ...................... 438/758 |
| 7,270,715 | B2 | * | 9/2007 | Dando et al. .................. 118/733 |
| 2002/0076490 | A1 | * | 6/2002 | Chiang et al. ............... 427/248.1 |
| 2004/0149214 | A1 | * | 8/2004 | Hirose et al. .................. 118/715 |
| 2005/0150452 | A1 | * | 7/2005 | Sen et al. ....................... 118/715 |
| 2006/0112876 | A1 | * | 6/2006 | Choi et al. ..................... 118/715 |
| 2008/0053957 | A1 | * | 3/2008 | Wakabayashi .................. 216/67 |
| 2008/0070032 | A1 | * | 3/2008 | Otsuki ........................... 428/332 |
| 2009/0221149 | A1 | * | 9/2009 | Hammond et al. ........... 438/706 |

FOREIGN PATENT DOCUMENTS

| JP | 06-244123 | 9/1994 |
| JP | 2006-344701 | 12/2006 |

* cited by examiner

*Primary Examiner* — Keath Chen
*Assistant Examiner* — Aiden Lee
(74) *Attorney, Agent, or Firm* — Pearne & Gordon LLP

(57) ABSTRACT

A plasma processing apparatus includes a shower head that supplies a gas toward a substrate in a shower pattern through a plurality of gas discharge holes provided in a facing surface of the shower head facing a mounting table; a multiple number of gas exhaust holes provided in the facing surface of the shower head; a vertically movable ring-shaped member that is installed along a circumference of the mounting table and is configured to form, at a raised position, a processing space surrounded by the mounting table, the shower head and the ring-shaped member; a multiplicity of gas supply holes opened in an inner wall of the ring-shaped member to supply a gas into the processing space; and a plurality of gas exhaust holes opened in an inner wall of the ring-shaped member to evacuate the processing space.

5 Claims, 4 Drawing Sheets

US 8,852,386 B2

PLASMA PROCESSING APPARATUS

CROSS-REFERENCE TO RELATED APPLICATION

This application claims the benefit of Japanese Patent Application No. 2009-215586 filed on Sep. 17, 2009, and U.S. Provisional Application Ser. No. 61/252,184 filed on Oct. 16, 2009, the entire disclosures of which are incorporated herein by reference.

FIELD OF THE INVENTION

The present disclosure relates to a plasma processing apparatus.

BACKGROUND OF THE INVENTION

In the field of manufacture of a semiconductor device or the like, a shower head for supplying a gas toward a substrate such as a semiconductor wafer in a shower pattern has been conventionally used. To be specific, in a plasma processing apparatus that performs a plasma etching process on a substrate such as a semiconductor wafer, a mounting table for mounting the substrate thereon is installed in a processing chamber, and the shower head is installed so as to face the mounting table. The shower head is provided with a multiple number of gas discharge holes on its surface facing the mounting table, and a gas is supplied toward the substrate through the gas discharge holes in a shower pattern.

As the above-mentioned plasma processing apparatus, there is known a configuration in which a gas is exhausted downward from the vicinity of the mounting table so as to uniform a gas flow within the processing chamber. Further, in order to enhance uniformity of a plasma process in the surface, there is also known a plasma processing apparatus including a gas discharge unit for supplying a gas toward a periphery of a substrate on a mounting table in addition to the shower head (see, for example, Patent Document 1). Moreover, there is also known a plasma processing apparatus having a configuration in which a gas is upwardly exhausted toward an upper side of a processing chamber from the vicinity of a shower head (see, for example, Patent Document 2).
Patent Document 1: Japanese Patent Laid-open Publication No. 2006-344701
Patent Document 2: Japanese Patent No. 2662365

In the prior art as stated above, the plasma processing apparatuses are configured to exhaust a gas toward a lower side of the processing chamber from the vicinity of the mounting table (substrate) or to exhaust a gas toward an upper side of the processing chamber from the vicinity of the shower head. Accordingly, a gas supplied from the shower head flows from a center of the substrate to the periphery thereof. Such a gas flow may cause a difference in processing states of the center and the periphery of the substrate, resulting in deterioration of process uniformity in the surface. Furthermore, since a gas exhaust path needs to be provided in the vicinity of the mounting table (substrate) or in the vicinity of the shower head, an internal volume of the processing chamber may become much larger than the size of the substrate to be accommodated therein. Thus, unnecessary space may increase, which may hinder miniaturization of the entire apparatus.

BRIEF SUMMARY OF THE INVENTION

In view of the foregoing, the present disclosure provides a plasma processing apparatus capable of improving process uniformity in the wafer surface and reducing the size of the apparatus by reducing unnecessary space within a processing chamber, as compared to conventional cases.

In accordance with one aspect of the present disclosure, there is provided a plasma processing apparatus including: a shower head that is installed within a processing chamber for processing a substrate therein so as to face a mounting table for mounting a substrate thereon and supplies a gas toward the substrate in a shower pattern through a plurality of gas discharge holes provided in a facing surface of the shower head facing the mounting table; a multiple number of gas exhaust holes provided in the facing surface of the shower head; a vertically movable ring-shaped member that is installed along a circumference of the mounting table and is configured to form, at a raised position, a processing space surrounded by the mounting table, the shower head and the ring-shaped member; a multiplicity of gas supply holes opened in an inner wall of the ring-shaped member to supply a gas into the processing space; and a plurality of gas exhaust holes opened in an inner wall of the ring-shaped member to evacuate the processing space.

In accordance with the present disclosure, it is possible to provide the plasma processing apparatus capable of improving process uniformity in the wafer surface and reducing the size of the apparatus by reducing unnecessary space within the processing chamber, as compared to conventional cases.

BRIEF DESCRIPTION OF THE DRAWINGS

The disclosure may be understood by reference to the following description taken in conjunction with the following figures.

DETAILED DESCRIPTION OF THE INVENTION

Figure 1:
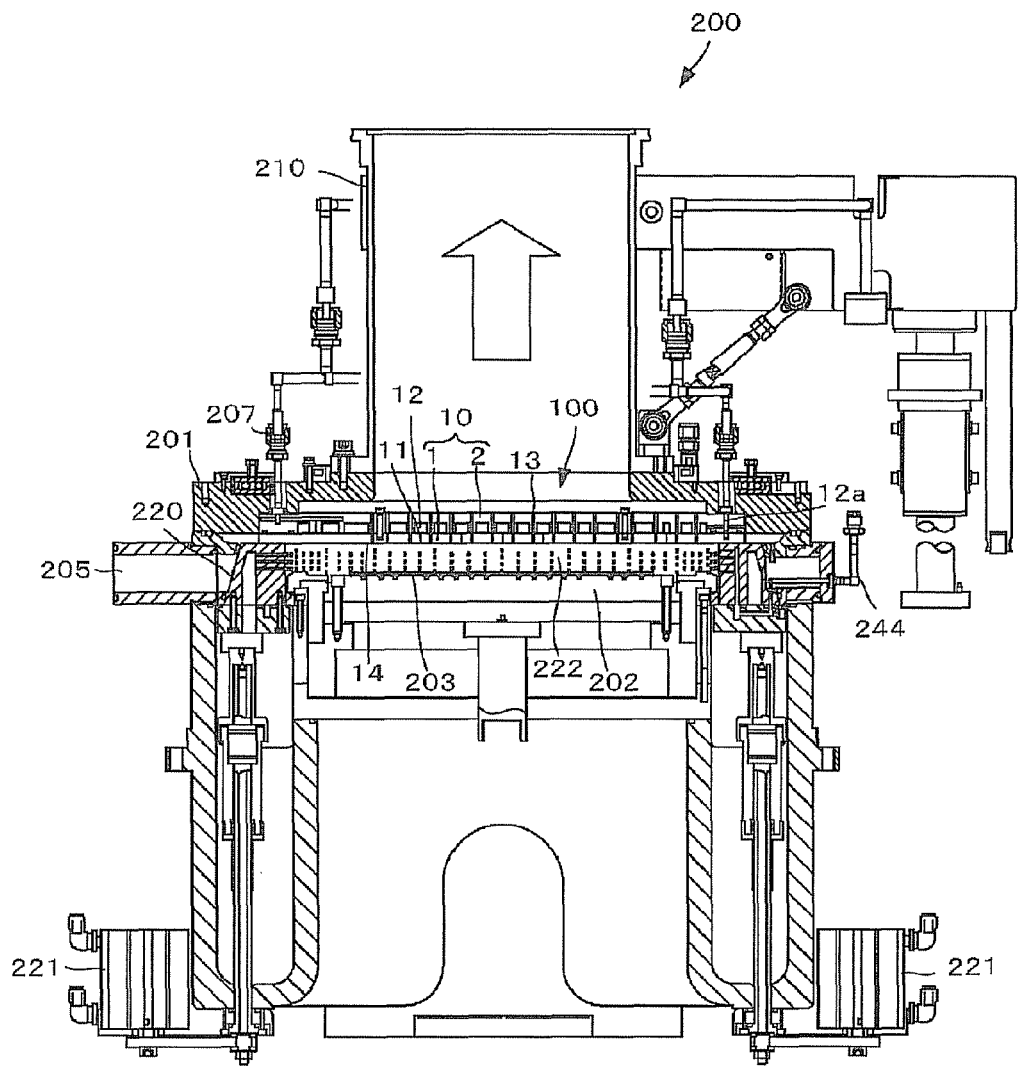
FIG. 1 is a longitudinal cross sectional view of a plasma processing apparatus in accordance with an embodiment of the present disclosure.
Figure 2:
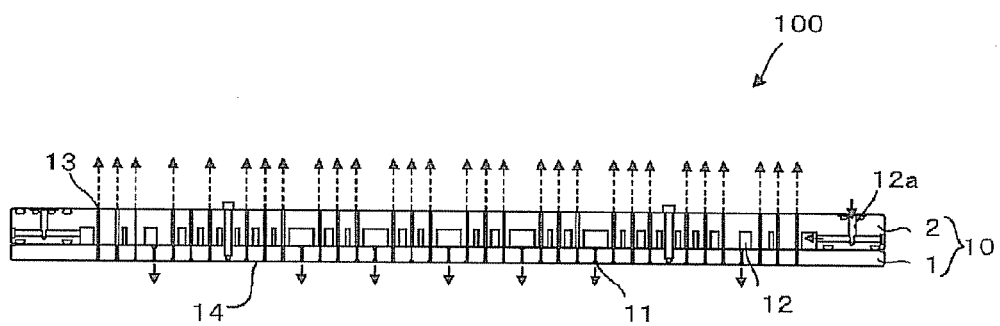
FIG. 2 is an enlarged longitudinal cross sectional view showing major parts of the plasma processing apparatus of FIG. 1.

Hereinafter, embodiments of the present disclosure will be described in detail with reference to the accompanying drawings.
FIG. 1 is a schematic view illustrating a cross sectional configuration of a plasma etching apparatus 200 as a plasma processing apparatus in accordance with an embodiment of the present disclosure. FIG. 2 is a cross sectional view showing a schematic configuration of a shower head 100 of the plasma etching apparatus 200. The plasma etching apparatus 200 is configured as a plasma etching apparatus of a capacitively coupled parallel plate type in which upper and lower electrode plates are arranged in parallel to each other and are connected to power supplies (not shown) for plasma generation.

As illustrated in FIG. 2, the shower head 100 is made up of a layered body 10 having two sheets of plate-shaped members: a lower member 1 and an upper member 2 placed on the top of the lower member 1. By way of example, the lower member 1 and the upper member 2 are made of aluminum of which surface is anodically oxidized. As shown in FIG. 1, the shower head 100 is installed in a processing chamber 201 of the plasma etching apparatus 200 so as to face a mounting table 202 that mounts a semiconductor wafer (substrate) thereon. That is, the lower member 1 shown in FIG. 2 is installed to serve as a surface 14 facing the mounting table 202 shown in FIG. 1.

In the layered body 10, the lower member 1 having the surface 14 facing the mounting table 202 is provided with a multiple number of gas discharge holes 11, and a gas flow path 12 communicating with the gas discharge holes 11 is formed between the lower member 1 and the upper member 2. The gas discharge holes 11 are configured to supply a gas toward the substrate (lower side of FIG. 2) in a shower pattern, as indicated by arrows in FIG. 2. Further, a gas inlet 12a through which the gas is introduced into the gas flow path 12 is provided in a peripheral portion of the layered body 10.

Further, a multiplicity of gas exhaust holes 13 are formed through the layered body 10, i.e., through the lower member 1 and the upper member 2. The gas exhaust holes 13 serve as a gas exhaust mechanism that performs evacuation so as to allow the gas to flow from a substrate side (lower side of FIG. 2) toward an opposite side of the substrate (upper side of FIG. 2), as indicated by dotted-line arrows in FIG. 2. The gas exhaust holes 13 are uniformly distributed over the entire region of the shower head 100 except its peripheral portion (configured as a fixing part to be fixed to the processing chamber 201). By way of example, each gas exhaust hole 13 has a diameter of about 1.2 mm. For example, in case that the shower head 100 is designed to process a semiconductor wafer having a diameter of about 12 inches (about 300 mm), the number of the gas exhaust holes 13 may be about 2000 to 2500. Further, in the present embodiment, the shower head 100 has an appearance of a circular plate shape conforming to the shape of the semiconductor wafer to be processed.

The processing chamber (processing vessel) 201 of the plasma etching apparatus 200 shown in FIG. 1 is formed in a cylindrical shape made of, e.g., aluminum of which surface is anodically oxidized. The processing chamber 201 is grounded. The mounting table 202 installed within the processing chamber 201 is configured to mount the semiconductor wafer as a processing target substrate thereon and the mounting table 202 serves as a lower electrode. The mounting table 202 is connected with a high frequency power application device such as a non-illustrated high frequency power supply.

An electrostatic chuck 203 that electrostatically attracts and holds the semiconductor wafer W thereon is provided on the mounting table 202. The electrostatic chuck 203 includes an electrode embedded in an insulator. The semiconductor wafer is electrostatically attracted and held by a Columbic force generated by a DC voltage applied to this electrode. Further, the mounting table 202 is provided with a flow path (not shown) through which a temperature control medium is circulated, and, thus, a temperature of the semiconductor wafer attracted to and held on the electrostatic chuck 203 can be regulated to a preset temperature. Furthermore, provided in a sidewall of the processing chamber 201 is an opening 205 through which the semiconductor wafer is loaded into or unloaded from the processing chamber 201.

The shower head 100 illustrated in FIG. 2 is positioned above the mounting table 202 to face the mounting table 202 at a preset distance. The shower head 100 serving as the upper electrode and the mounting table 202 serving as the lower electrode form a pair of facing electrodes.

The gas inlet 12a of the shower head 100 is connected with a gas supply unit 207 of the processing chamber 201. A processing gas (etching gas) is supplied to the gas supply unit 207 from a non-illustrated gas supply source.

Further, a cylindrical gas exhaust pipe 210 is provided above the shower head 100, and a vacuum pump (not shown) such as a turbo molecular pump is connected to the gas exhaust pipe 210 via an opening/closing control valve, an opening/closing mechanism, and so forth.

A circular ring-shaped member 220 is installed around the mounting table 202 along the circumference of the mounting table 202. By way of example, the ring-shaped member 220 is made of aluminum coated with an insulating film and is configured to be movable up and down by an elevating mechanism 221 connected thereto. FIG. 1 shows the ring-shaped member 220 in a raised position. In this state, the opening 205, through which the semiconductor wafer is loaded into or unloaded from the processing chamber 201, is closed by the ring-shaped member 220. When the ring-shaped member 220 is in the raised position, a processing space 222 surrounded by the mounting table 202, the shower head 100 and the ring-shaped member 220 is formed above the mounting table 202. In this way, by forming the processing space 222 by the vertically movable ring-shaped member 220, it is possible to form the processing space 222 only in a region directly above the mounting table 202. Thus, formation of an unnecessary space extending outward from a periphery of the mounting table 202 in a horizontal direction can be suppressed.

Figure 3:
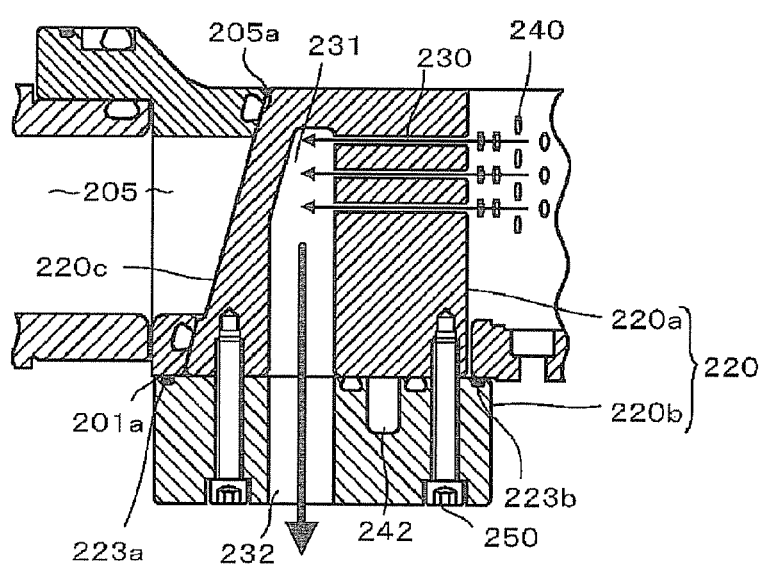
FIG. 3 is an enlarged longitudinal cross sectional view showing major parts of the plasma processing apparatus of FIG. 1.

Referring to FIG. 3, the ring-shaped member 220 includes an upper ring-shaped member 220a and a lower ring-shaped member 220b which are fixed to each other by screws 250. The upper ring-shaped member 220a is provided with a plurality of gas exhaust holes 230 opened in an inner surface of the upper ring-shaped member 220a. These gas exhaust holes 230 communicate with a ring-shaped gas exhaust path 231 formed within the upper ring-shaped member 220a. With this configuration, the inside of the processing space 222 is exhausted through the gas exhaust holes 230 and the ring-shaped gas exhaust path 231.

Figure 4:
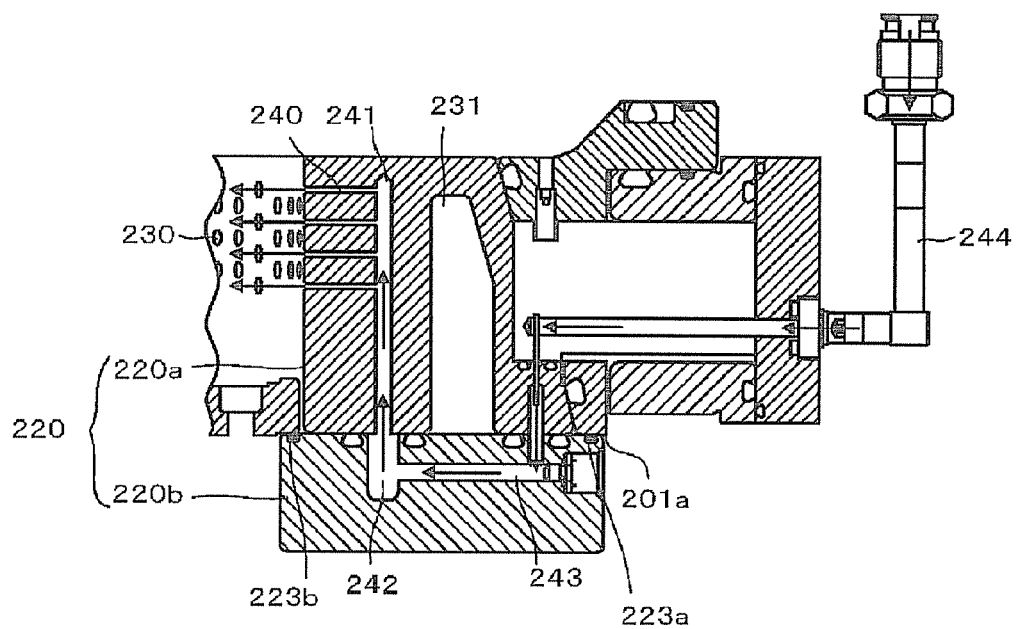
FIG. 4 is an enlarged longitudinal cross sectional view showing major parts of the plasma processing apparatus of FIG. 1.

As illustrated in FIG. 4, the ring-shaped gas exhaust path 231 is formed within the upper ring-shaped member 220a in a ring shape, and the gas exhaust holes 230 communicating with the ring-shaped gas exhaust path 231 are uniformly arranged at a preset interval along a circumferential direction of the ring-shaped member 220. Further, as shown in FIG. 3, gas is exhausted downward through one or more gas exhaust ports 232 provided in the lower ring-shaped member 220b. Further, FIG. 3 illustrates a cross sectional configuration of a part in which the opening 205 for loading and unloading the semiconductor wafer into/from the processing chamber 201 is provided. The opening 205 is closed by bringing an inclined outer surface 220c of the upper ring-shaped member 220a into contact with an inner end 205a of the opening 205. Furthermore, since a width of the lower ring-shaped member 220b in a diametric direction is larger than that of the upper ring-shaped member 220a, an inner periphery and an outer periphery of the lower ring-shaped member 220b protrude outward from the upper ring-shaped member 220a. Upper surfaces of these protruding portions are in contact with a flange 201a of the processing chamber 201, and, thus, the inside of the processing space 222 forms an electrically closed circuit. Further, respectively provided at contact positions between the lower ring-shaped member 220b and the flange 201a are an outer electric connection member 223a and an inner electric connection member 223b that are made of, e.g., a conductive member of a spiral shape and allow a secure electric connection between the lower ring-shaped member 220b and the flange 201a. The inner electric connection member 223b is provided for a return of a high frequency wave of the ring-shaped member 220, while the outer electric connection member 223a is provided for a return of a high frequency wave of the shower head 100 serving as the upper electrode.

Moreover, as shown in FIG. 4, the upper ring-shaped member 220a is provided with a plurality of gas supply holes 240 opened in its inner surface. These gas supply holes 240 are uniformly arranged at a preset interval along a circumferential direction of the ring-shaped member 220 and communicate with a ring-shaped gas flow path 242 provided within the lower ring-shaped member 220b via a vertical hole 241 provided within the upper ring-shaped member 220a. The ring-shaped gas flow path 242 is formed within the lower ring-shaped member 220b in a ring shape, as illustrated in FIG. 3, and is connected with a processing gas supply mechanism 244 that supplies a processing gas from the outside via one or more processing gas supply ports 243 formed through the lower ring-shaped member 220b and the upper ring-shaped member 220a, as shown in FIG. 4. The processing gas supplied from the processing gas supply mechanism 244 is introduced into the processing space 222 from the gas supply holes 240 of the upper ring-shaped member 220a. Moreover, although FIG. 4 illustrates that the gas supply holes 240 are formed in a substantially horizontal direction, the gas supply holes 240 may be formed at a preset inclination angle with respect to a horizontal direction, and the processing gas may be supplied from the upside toward the downside, i.e., to a surface of the substrate, for example.

As discussed above, since the plasma etching apparatus 200 has the vertically movable ring-shaped member 220, the processing space 222 can be formed only in a region directly above the mounting table 202. Accordingly, formation of an unnecessary space extending outward in a horizontal direction can be suppressed. Thus, consumption of the processing gas can be reduced. Furthermore, since the supply and the exhaust of the gas is performed through the ring-shaped member 220, the state of the processing gas within the processing space 222 can be more accurately controlled, and, thus, uniform processing can be carried out.

In addition, although the opening 205 for loading and unloading the semiconductor wafer into/from the processing chamber 201 makes an asymmetric shape, the processing space 222 has a physically symmetric shape, and, thus, plasma can be prevented from being affected by such an asymmetric shape. Therefore, more uniform processing can be carried out. Furthermore, since the opening 205 can be opened and closed by the vertical movement of the ring-shaped member 220, the configuration of the apparatus can be simplified as compared to a case of installing an additional opening/closing mechanism.

Figure 5:
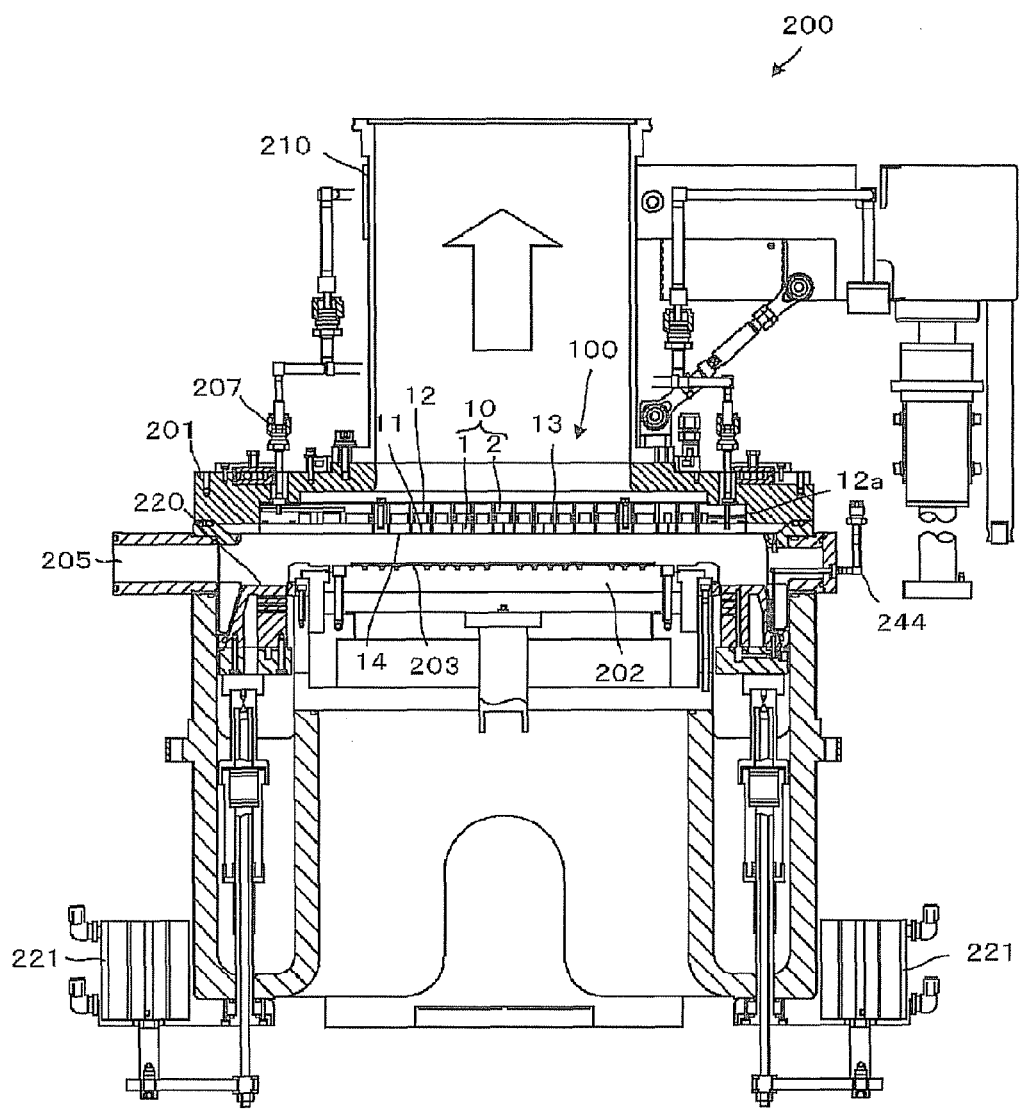
FIG. 5 is a longitudinal cross sectional view showing a state in which a ring-shaped member of the plasma processing apparatus of FIG. 1 is lowered.

To perform a plasma etching on a semiconductor wafer by using the plasma etching apparatus 200 having the above-described configuration, the opening 205 is opened by lowering the ring-shaped member 220, as illustrated in FIG. 5. In this state, the semiconductor wafer is loaded into the processing chamber 201 through the opening 205 and is electrostatically attracted to and held on the electrostatic chuck 203 to be mounted on the electrostatic chuck 203.

Subsequently, the opening 205 is closed by elevating the ring-shaped member 220, and, thus, the processing space 222 is formed above the semiconductor wafer. Then, the processing space 222 within the processing chamber 201 is evacuated to a preset vacuum level by a vacuum pump or the like.

Thereafter, a processing gas (etching gas) is supplied from the gas supply unit 207 into the gas inlet 12a of the shower head 100 at a certain flow rate. The processing gas is then supplied toward the semiconductor wafer on the mounting table 202 from the gas discharge holes 11 via the gas flow path 12 of the shower head 100 in a shower pattern. Concurrently, a processing gas (etching gas) is supplied from the processing gas supply mechanism 244 into the ring-shaped gas flow path 242 of the ring-shaped member 220 at a certain flow rate. This processing gas is supplied toward the semiconductor wafer on the mounting table 202 from the gas supply holes 240 via the vertical hole 241 of the ring-shaped member 220.

Then, an internal pressure of the processing chamber 201 is maintained at a preset pressure, and then a high frequency power of a preset frequency such as about 13.56 MHz, is applied to the mounting table 202. As a result, a high frequency electric field is generated between the shower head 100 serving as the upper electrode and the mounting table 202 serving as the lower electrode, and the etching gas is dissociated and excited into plasma. Then, the etching process is performed on the semiconductor wafer by the plasma.

In the etching process as described above, the processing gas supplied from the gas discharge holes 11 of the shower head 100 and the processing gas supplied from the gas supply holes 240 of the ring-shaped member 220 are exhausted through the gas exhaust holes 13 distributed in the shower head 100 and through the gas exhaust holes 230 of the ring-shaped member 220. Accordingly, unlike in a case of exhausting the gas through a lower portion of the processing chamber 201, a gas does not flow from a central portion of the semiconductor wafer toward a peripheral portion thereof. Thus, the processing gas can be more uniformly supplied to the semiconductor wafer. As a result, since plasma can be generated uniformly, uniform etching can be performed on each area of the semiconductor wafer. That is, process uniformity in the wafer surface can be improved.

Upon the completion of the plasma etching process, the application of the high frequency power and the supply of the processing gas are stopped, and the semiconductor wafer is unloaded from the processing chamber 201 in the reverse order to that described above.

As discussed above, since the processing gas is supplied and exhausted from the shower head 100 and the ring-shaped member 220 in the plasma etching apparatus 200 in accordance with the present embodiment, the processing gas can be more uniformly supplied to the semiconductor wafer. Accordingly, uniform etching process can be performed on each area of the semiconductor wafer.

Moreover, in the plasma etching apparatus 200 as described above, since the gas is exhausted through the gas exhaust holes 13 of the shower head 100 and the gas exhaust holes 230 of the ring-shaped member 220, a gas exhaust path need not be provided in the vicinity of the mounting table 202 or the shower head 100, unlike in conventional cases. Therefore, a diameter of the processing chamber 201 can be made similar to an outer diameter of the semiconductor wafer as a processing target substrate, so that the size of the apparatus can be reduced. Furthermore, since the vacuum pump is installed above the processing chamber 201 and the gas is exhausted from a region closer to the processing space of the processing chamber 201, gas exhaust can be carried out efficiently. Further, since two gas exhaust systems are provided, a capacity of an individual vacuum pump can be reduced, and, thus, the size of the apparatus can be further reduced.

Moreover, the present disclosure is not limited to the above-stated embodiments but can be modified in various ways. By way of example, although the above-described embodiment has been described for the case of applying a high frequency power of a single frequency to the mounting table (lower electrode), the present disclosure can also be applicable to a plasma etching apparatus that applies dual frequency powers to an upper and lower electrode or a plasma etching apparatus that applies multiple frequency powers to a lower electrode.

What is claimed is:

1. A plasma processing apparatus comprising:
   a shower head that is installed within a processing chamber for processing a substrate therein so as to face a mounting table for mounting a substrate thereon and supplies a gas toward the substrate in a shower pattern through a plurality of gas discharge holes provided in a facing surface of the shower head facing the mounting table;
   a multiple number of gas exhaust holes provided in the facing surface of the shower head;
   a vertically movable ring-shaped member that is installed along a circumference of the mounting table and is configured to form, at a raised position, a processing space surrounded by the mounting table, the shower head and the ring-shaped member;
   a multiplicity of gas supply holes opened in an inner wall of the ring-shaped member to supply a gas into the processing space; and
   a plurality of gas exhaust holes opened in the inner wall of the ring-shaped member to evacuate the processing space,
   wherein, at the raised position, the inner wall of the ring-shaped member is positioned close to an outer sidewall of the mounting table, such that the processing space is formed only in a region directly above the mounting table, and
   at least a part of the gas supply holes of the ring-shaped member is formed to have a preset inclination angle with respect to the facing surface, such that the gas is supplied toward the substrate, and
   wherein the ring-shaped member includes an upper ring-shaped member and a lower ring-shaped member,
   a ring-shaped gas exhaust path communicating with the plurality of gas exhaust holes is provided within the upper ring-shaped member and a gas exhaust port is provided within the lower ring-shaped member,
   the gas is exhausted downward through the ring-shaped gas exhaust path and the gas exhaust port,
   a vertical hole communicating with the multiplicity of gas supply holes is provided within the upper ring-shaped member and a ring-shaped gas flow path communicating with the vertical hole is provided within the lower ring-shaped member, and
   the ring-shaped gas flow path is connected with a processing gas supply mechanism via at least one processing gas supply port formed through the lower ring-shaped member and the upper ring-shaped member,
   wherein an outer periphery of the lower ring-shaped member protrudes outward from the upper ring-shaped member, and protruding portions of the lower ring-shaped member are in contact with a flange.

2. The plasma processing apparatus of claim 1, further comprising:
   an openable/closable opening that is provided in a sidewall of the processing chamber and is positioned between the mounting table and the shower head to allow loading and unloading of the substrate into/from the processing chamber,
   wherein the loading and unloading of the substrate is performed when the ring-shaped member is in a lowered position.

3. The plasma processing apparatus of claim 1, wherein the ring-shaped member is made of aluminum coated with an insulating film.

4. The plasma processing apparatus of claim 1, wherein a width of the lower ring-shaped member in a diametric direction is larger than that of the upper ring-shaped member.

5. The plasma processing apparatus of claim 1, wherein an electric connection member is provided between the protruding portions of the lower ring-shaped member and the flange.

* * * * *